US007744382B2

(12) United States Patent
Zheng et al.

(10) Patent No.: US 7,744,382 B2
(45) Date of Patent: Jun. 29, 2010

(54) ELECTRICAL CONNECTOR WITH IMPROVED CONTACT ARRANGEMENT

(75) Inventors: Qi-Sheng Zheng, Kunshan (CN); Jia-Yong He, Kunshan (CN); Hao Gu, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/384,865

(22) Filed: Apr. 9, 2009

(65) Prior Publication Data

US 2009/0258539 A1 Oct. 15, 2009

(30) Foreign Application Priority Data

Apr. 9, 2008 (CN) .................... 2008 2 0035067 U
Apr. 21, 2008 (CN) .................... 2008 2 0034872 U

(51) Int. Cl.
*H05K 1/00* (2006.01)

(52) U.S. Cl. ........................................ 439/79; 439/577

(58) Field of Classification Search ................... 439/79, 439/92, 577, 607.4, 620.12
See application file for complete search history.

(56) References Cited

U.S. PATENT DOCUMENTS 5,725,386 A * 3/1998 Davis et al. .................... 439/79
5,779,489 A * 7/1998 Davis et al. .................... 439/79
5,975,958 A * 11/1999 Weidler ................. 439/620.22
7,614,887 B1 * 11/2009 Yi et al. ......................... 439/79

* cited by examiner

*Primary Examiner*—Chandrika Prasad
(74) *Attorney, Agent, or Firm*—Wei Te Chung; Andrew C. Cheng; Ming Chieh Chang

(57) ABSTRACT

An electrical connector (100) defining an inserting port (10) for connecting a corresponding plug, includes a first contact module and a second contact module fixed with each other. The first contact module includes a first housing (1) and a number of first contacts (31) insert molded in the first housing (1). The first housing (1) has a tongue (12) extending into the inserting port (10). Each first contact (31) has a first contact portion (311) extending to a free end of the tongue (12). The second contact module includes a second housing (2) and a number of second contacts (32) insert molded in the second housing (2). Each second contact (32) has a second contact portion (321) extending out of the second housing (2). The second contact portions (321) extend to the tongue and offsetting with the first contact portion (311) along a length direction of the tongue (12).

18 Claims, 15 Drawing Sheets

ELECTRICAL CONNECTOR WITH IMPROVED CONTACT ARRANGEMENT

BACKGROUND OF THE INVENTION

1. Field of the Invention

The present invention relates to an electrical connector, and more particularly to electrical connectors with improved contact arrangement.

2. Description of Related Art

Universal Serial Bus (USB) is used widely in variety electronic devices as a standard and simple interface. Up to now, previous notable releases of the USB specification were 0.9, 1.0, 1.1 and 2.0. Equipment conforming to any version of the standard will also work with devices designed to any previous specification (known as: backward compatibility).

USB mentioned above supports three data rates respectively as follows: 1) A Low Speed rate of up to 1.5 Mbit/s (187.5 KB/s) that is mostly used for Human Interface Devices (HID) such as keyboards, mice, and joysticks; 2) A Full Speed rate of up to 12 Mbit/s (1.5 MB/s). Full Speed was the fastest rate before the USB 2.0 specification and many devices fall back to Full Speed. Full Speed devices divide the USB bandwidth between them in a first-come first-served basis and it is not uncommon to run out of bandwidth with several isochronous devices. All USB Hubs support Full Speed; 3) A Hi-Speed rate of up to 480 Mbit/s (60 MB/s).

USB connector is soldered on a circuit board of an computer usually. The USB 2.0 A type connector according to USB-IF usually comprises an insulative housing with a tongue plate extending forwardly, four contacts retained in the insulative housing and a metal shield. Each contact has a contact portion extending to a lower side of the tongue plate and exposing out thereof flexibly. The contact portion presents as arc type and can move along a thickness direction of the tongue. The four contacts comprise a power contact, a ground contact, a − data contact and a + data contact. The − data contact and + data contact present as a pair of differential signal contacts which are located between the power contact and the ground contact. The metal shield encloses the tongue plate and forms a first receiving space for receiving a USB plug. However, as the development of electric industry, even the USB 2.0 can not satisfy the requirement of many electric devices. For example, under a circumstance transmitting an audio or video file, which is always up to hundreds MB, even to 1 or 2 GB, currently transmission rate of USB is not sufficient.

Hence, an electrical connector which is based on USB interface, but has a high signal transmission speed and an improved contacts arrangement, is desired to overcome the disadvantage of the prior art.

BRIEF SUMMARY OF THE INVENTION

According to the present invention, an electrical connector defining an inserting port for connecting a corresponding plug, comprises: a first contact module comprising a first housing and a plurality of first contacts insert molded in the first housing, the first housing comprising a main body and a tongue extending to the inserting port from the main body, the main body defining a plurality of installed grooves at an inner side thereof, the tongue defining a plurality of receiving slots and a number of recesses recessed from a side surface thereof, the receiving slots and recesses being arranged in two rows along an inserting direction of the plug, each first contact has a flat contact portion retained in the recesses and a first soldering portion to be soldered on a circuit board; a second contact module comprising a second housing and a plurality of second contacts insert molded in the second housing, the second housing having a plurality of projections at an inner side thereof to engage with the installed grooves, each second contact having an elastic contact portion extending out of the second housing along a length direction of the second housing and positioned in the receiving slot; and a metal shell covering the first contact module and the second contact module.

According to another aspect of the present invention, an electrical connector defining an inserting port for connecting a corresponding plug, comprises: a first contact module comprising a first housing and a plurality of first contacts insert molded in the first housing, the first housing having a tongue extending into the inserting portion, each first contact having a first contact portion extending to a free end of the tongue; a second contact module comprising a second housing and a plurality of second contacts insert molded in the second housing, each second contact having a second contact portion extending out of the second housing along a length direction of the second housing, the second contact portions extending to the tongue and offsetting with the first contact portion along a length direction of the tongue; and a metal shell fixing the first contact module and the second contact module together.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
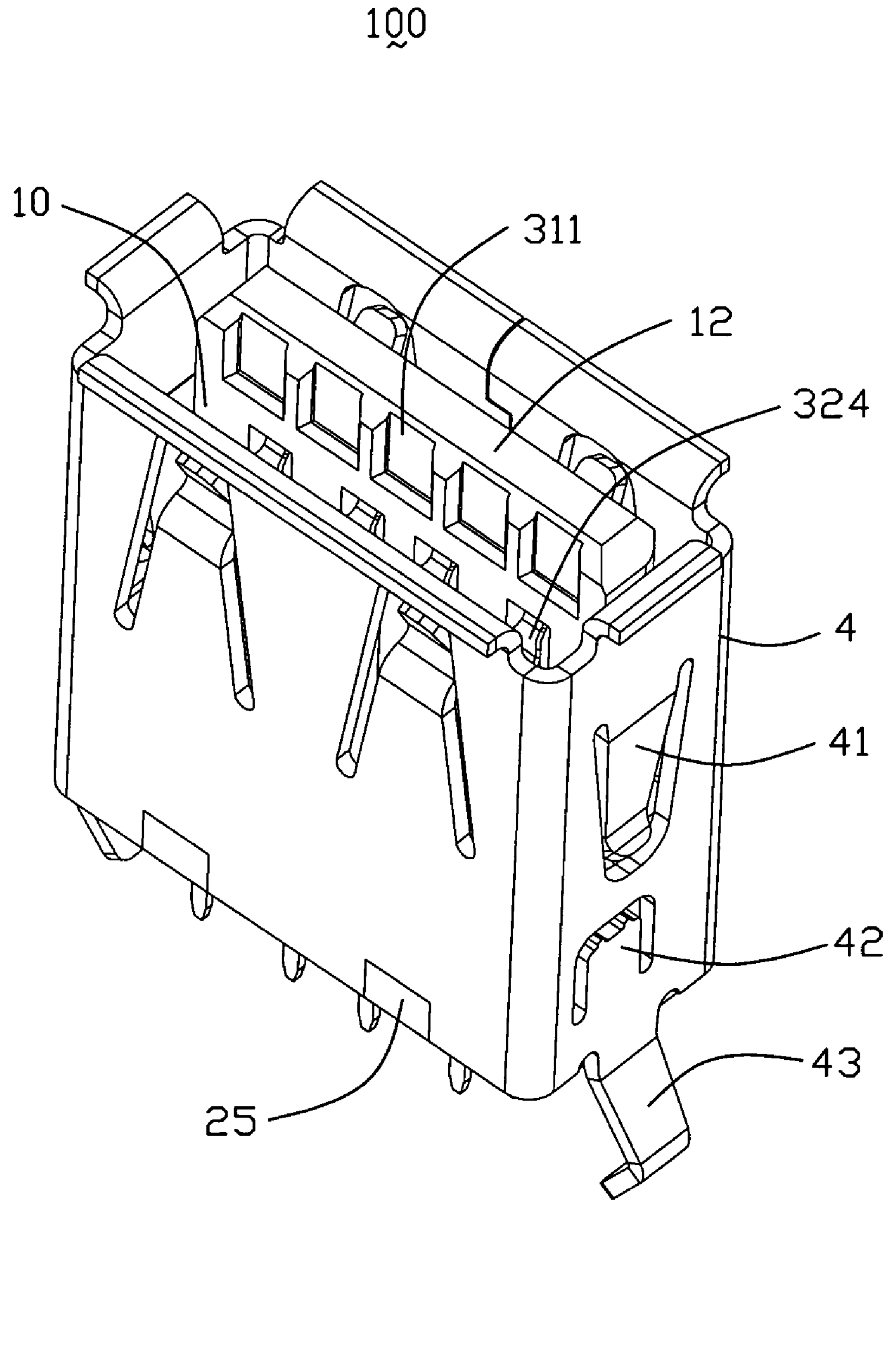
FIG. 1 is a perspective view of an electrical connector according to a first embodiment of the present invention.
Figure 2:
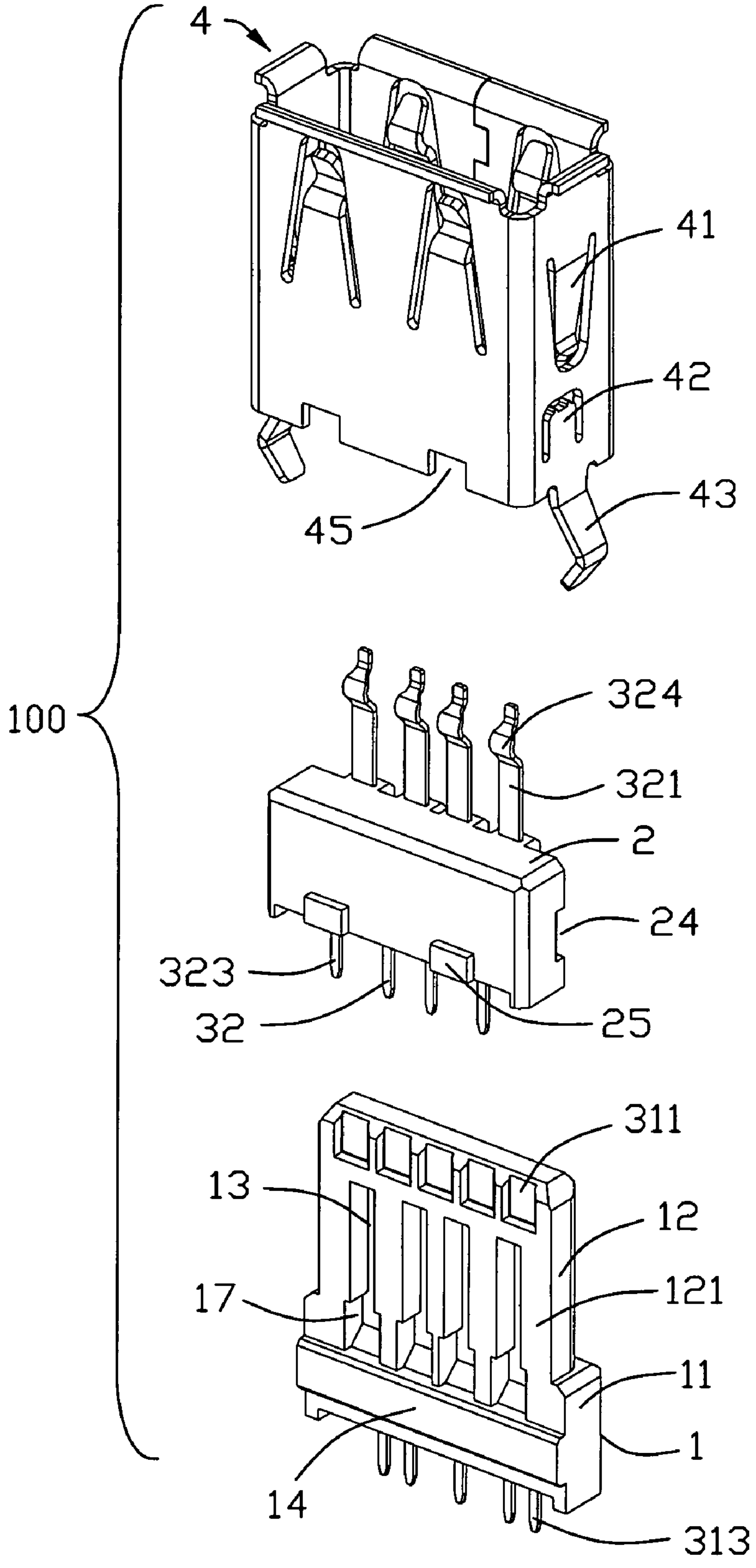
FIG. 2 is a partial exploded view of the electrical connector shown in FIG. 1.
Figure 4:
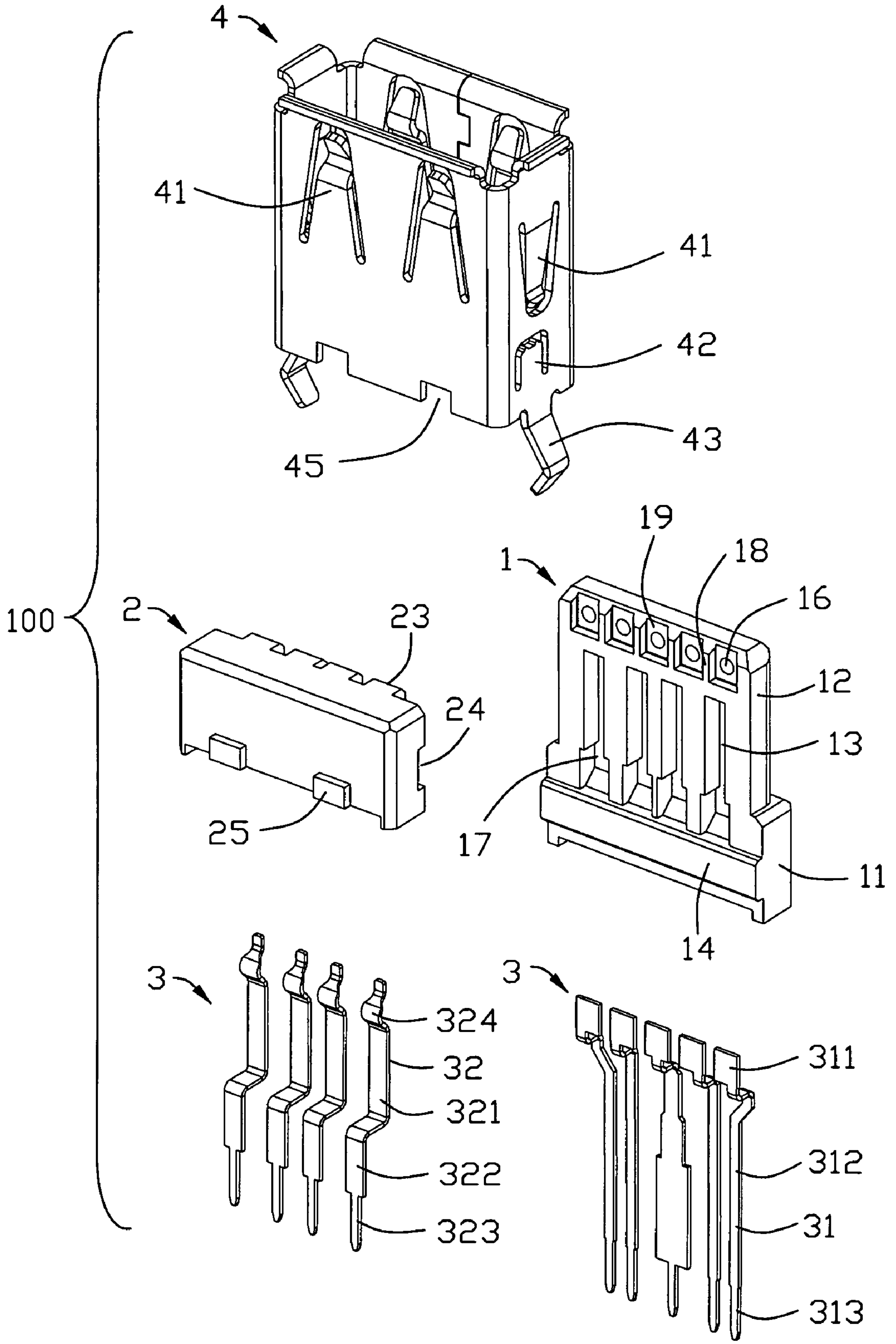
Figure 5:
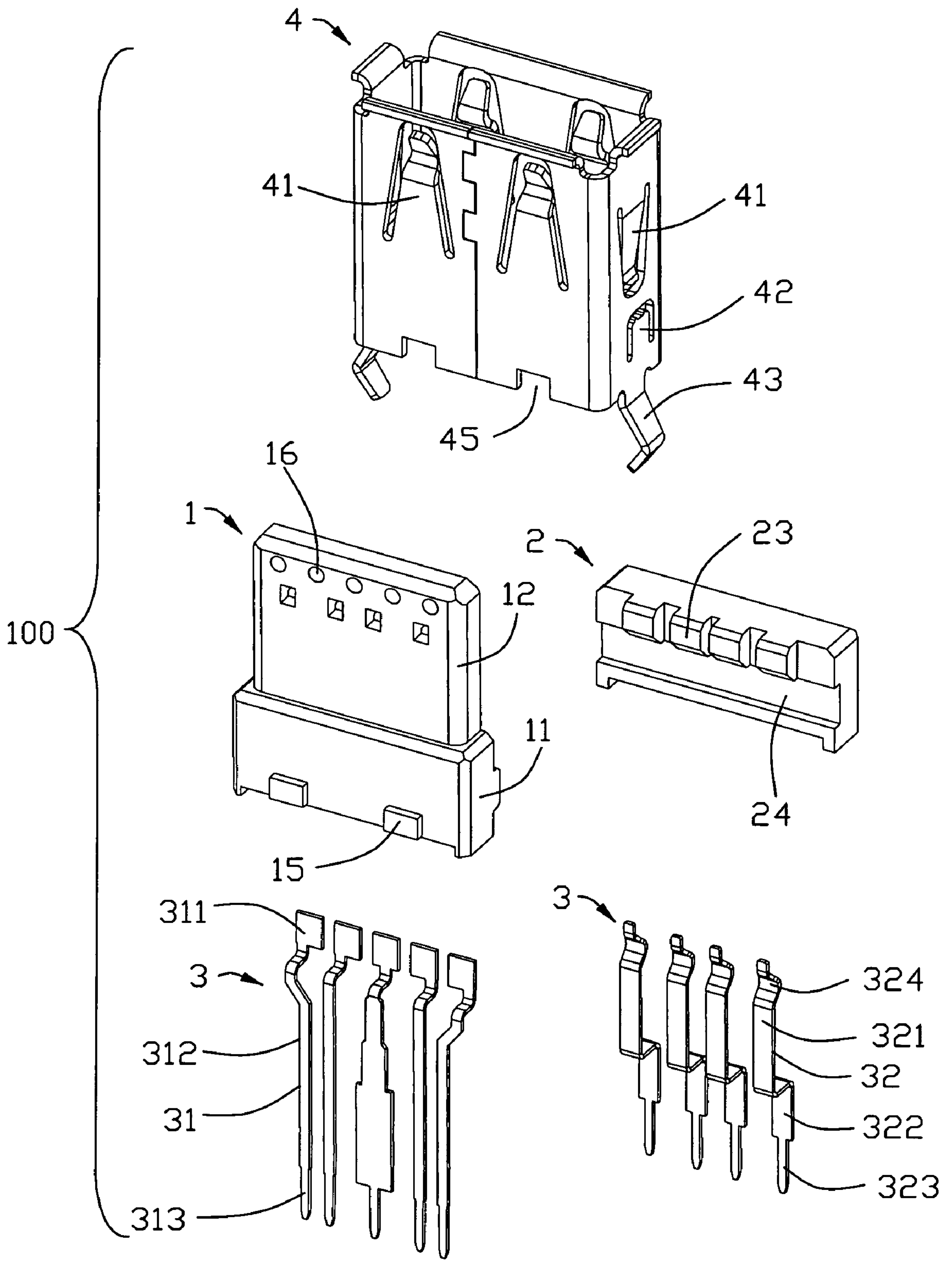
Figure 6:
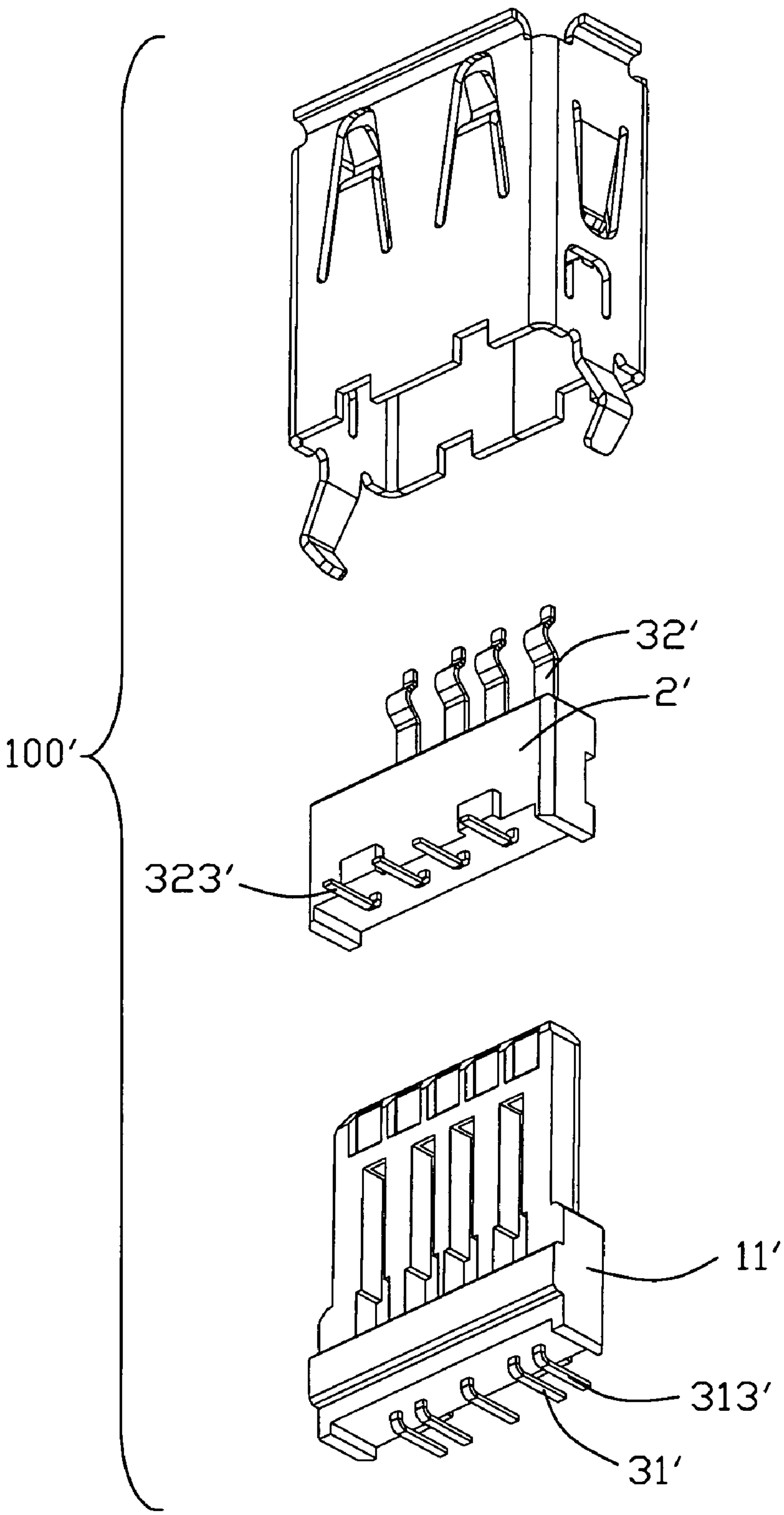
Figure 7:
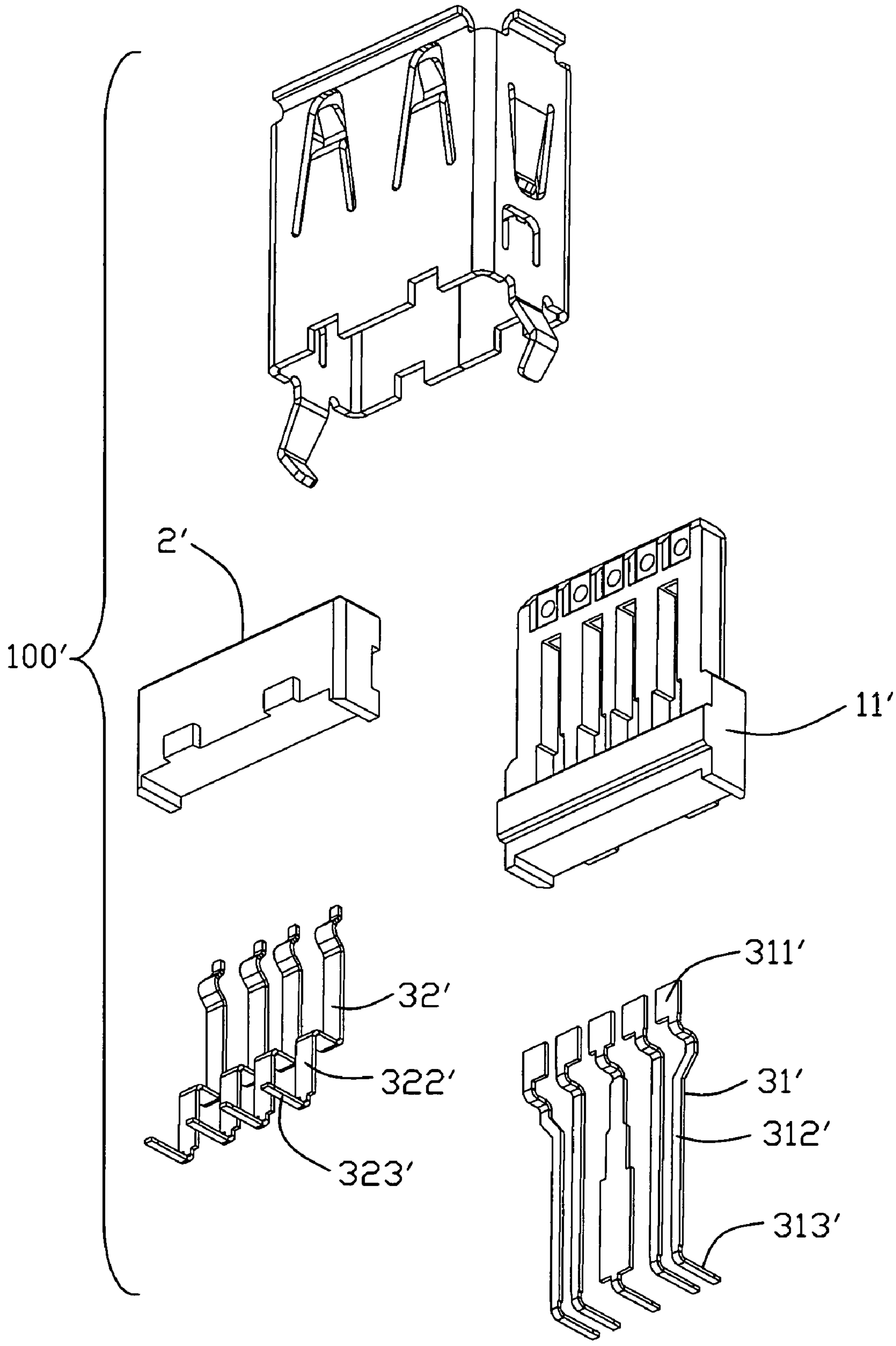
Figure 8:
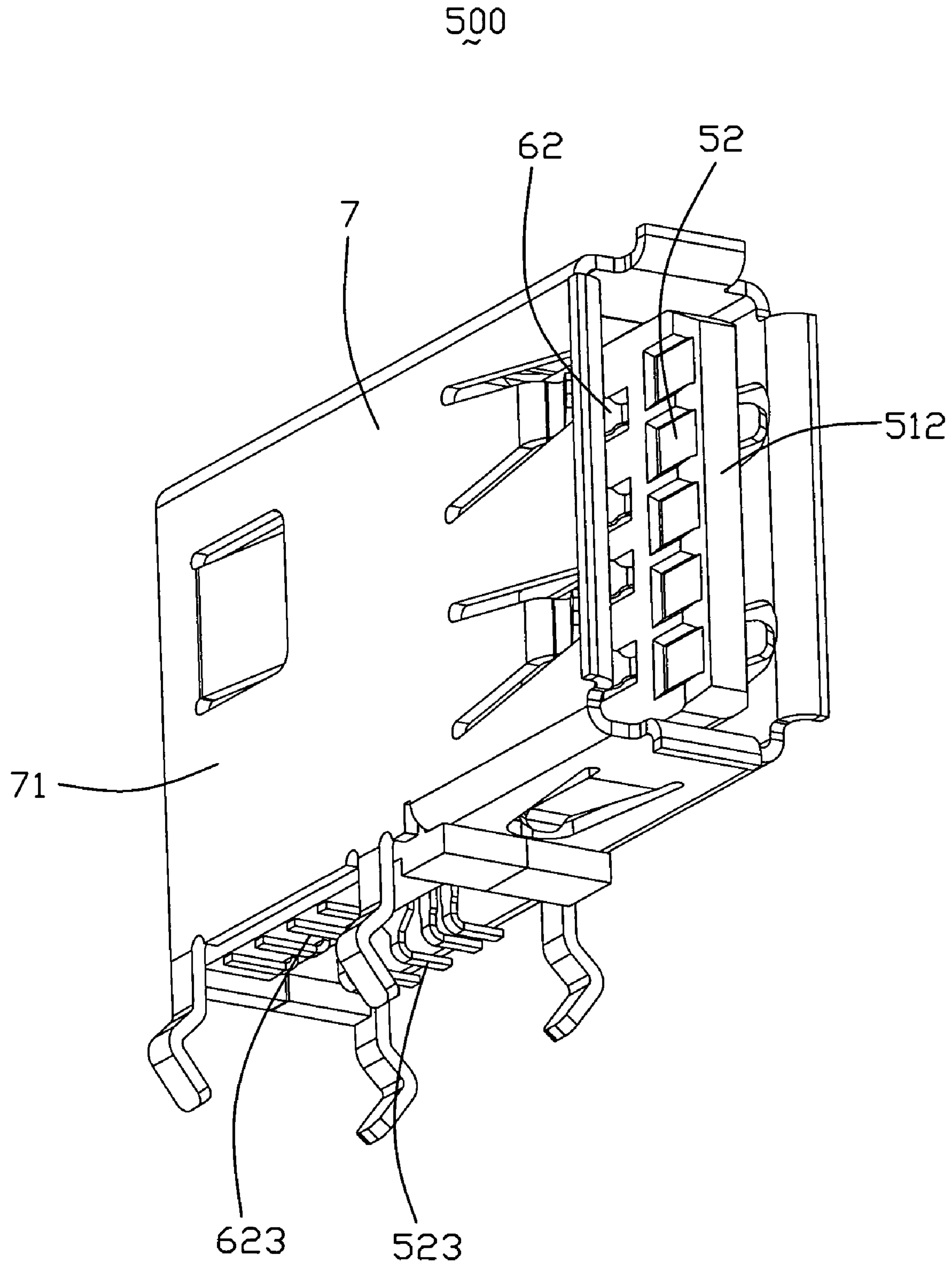
Figure 9:
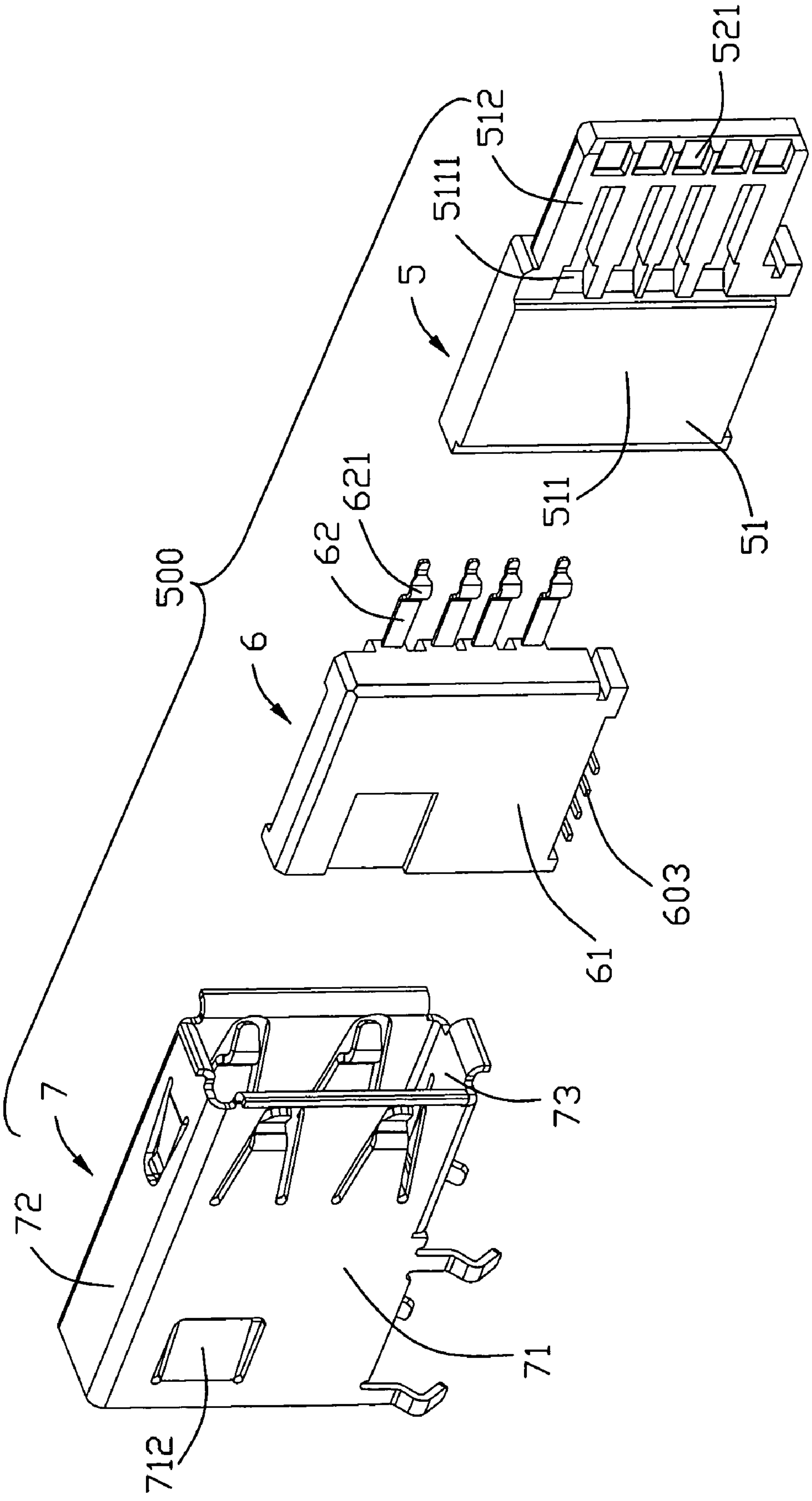
Figure 10:
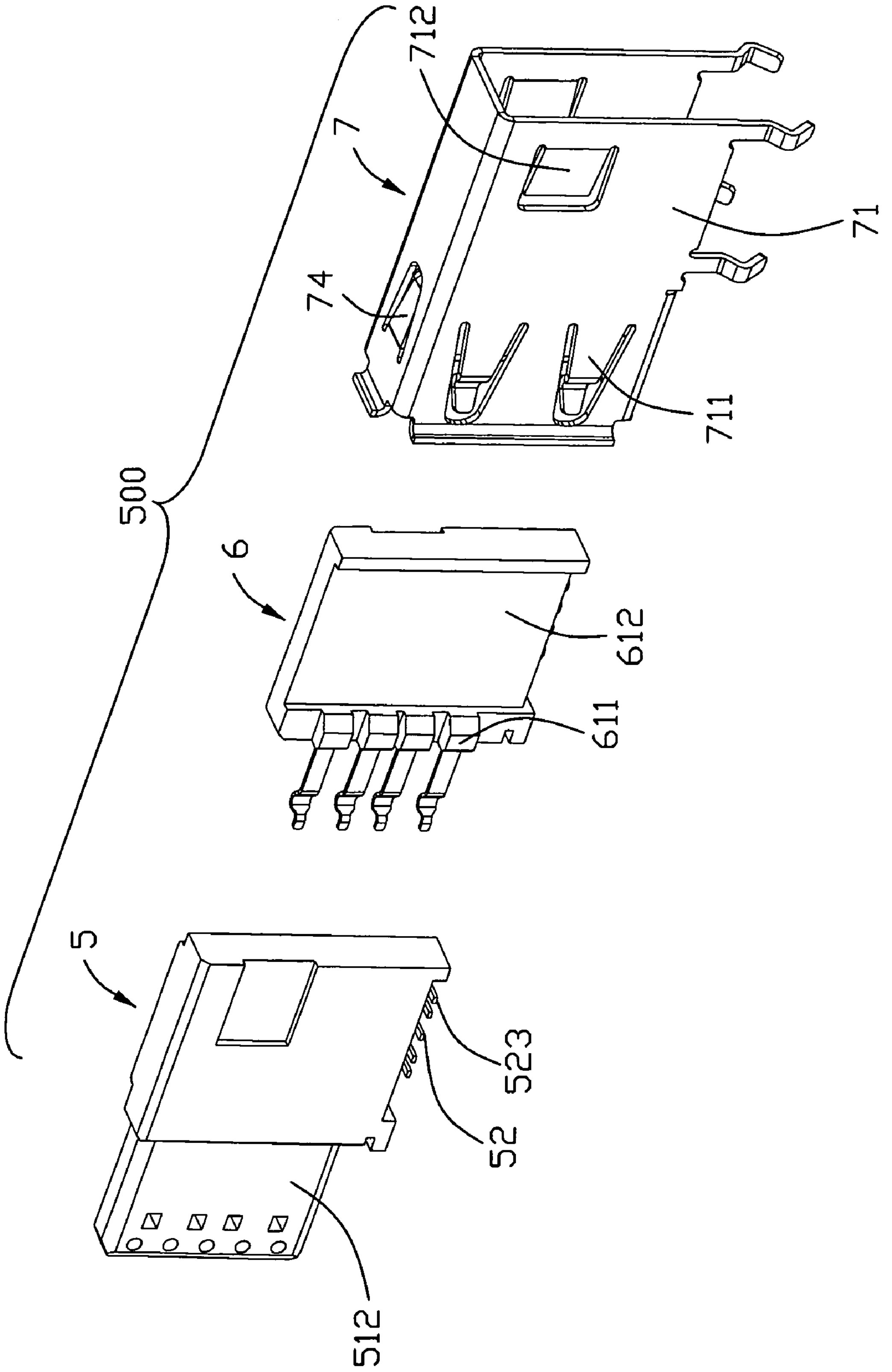
Figure 11:
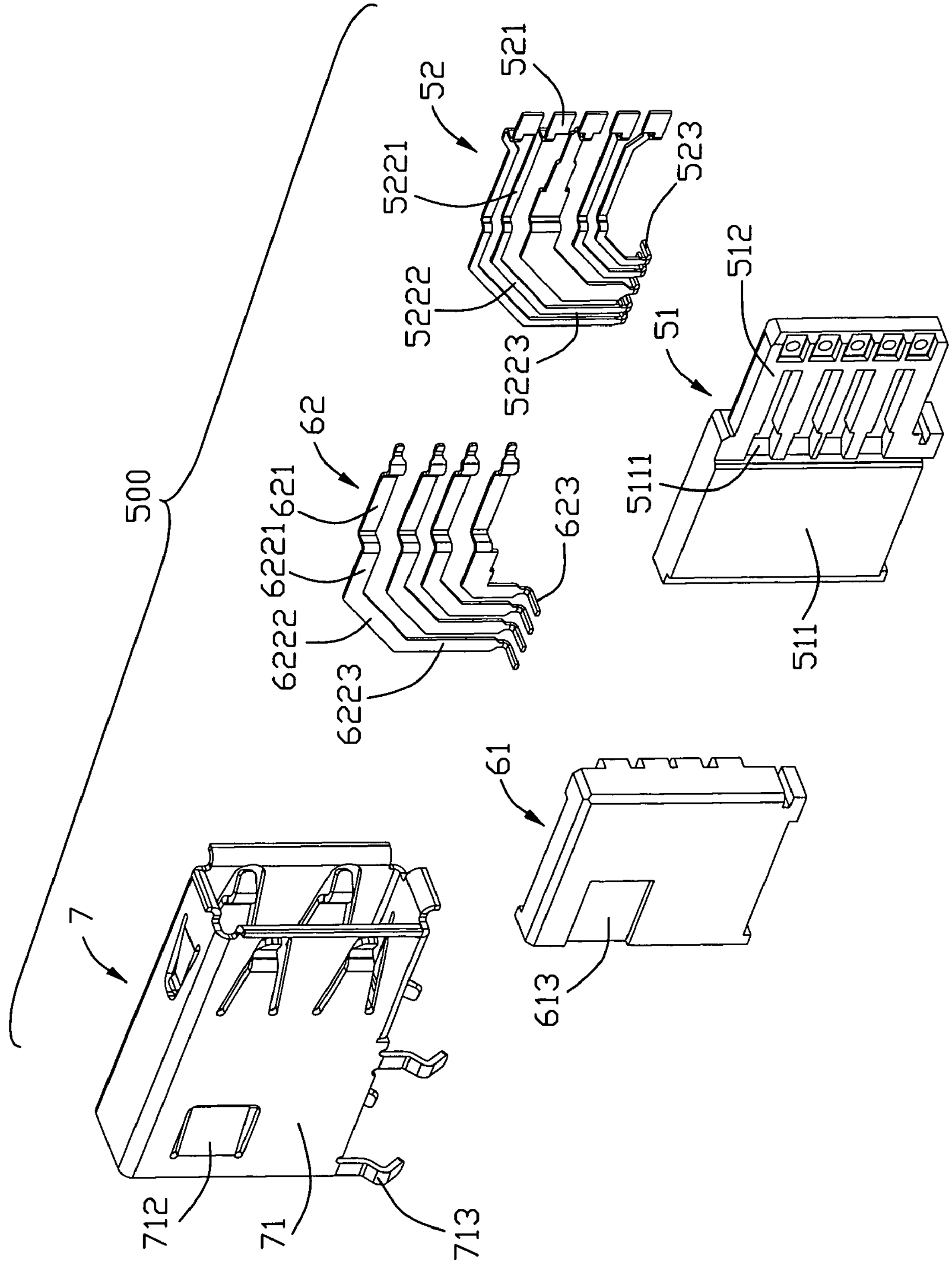
Figure 12:
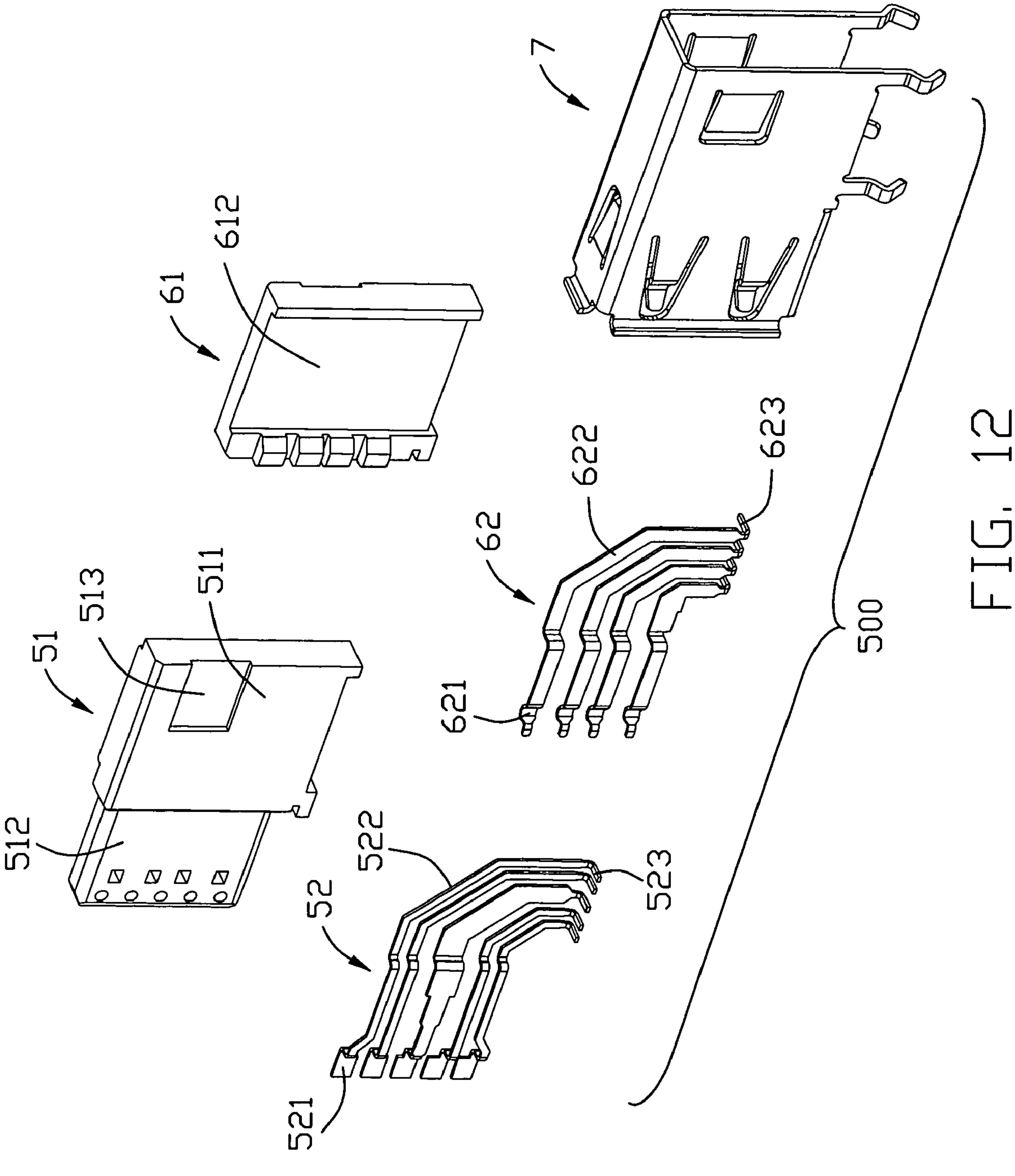
Figure 13:
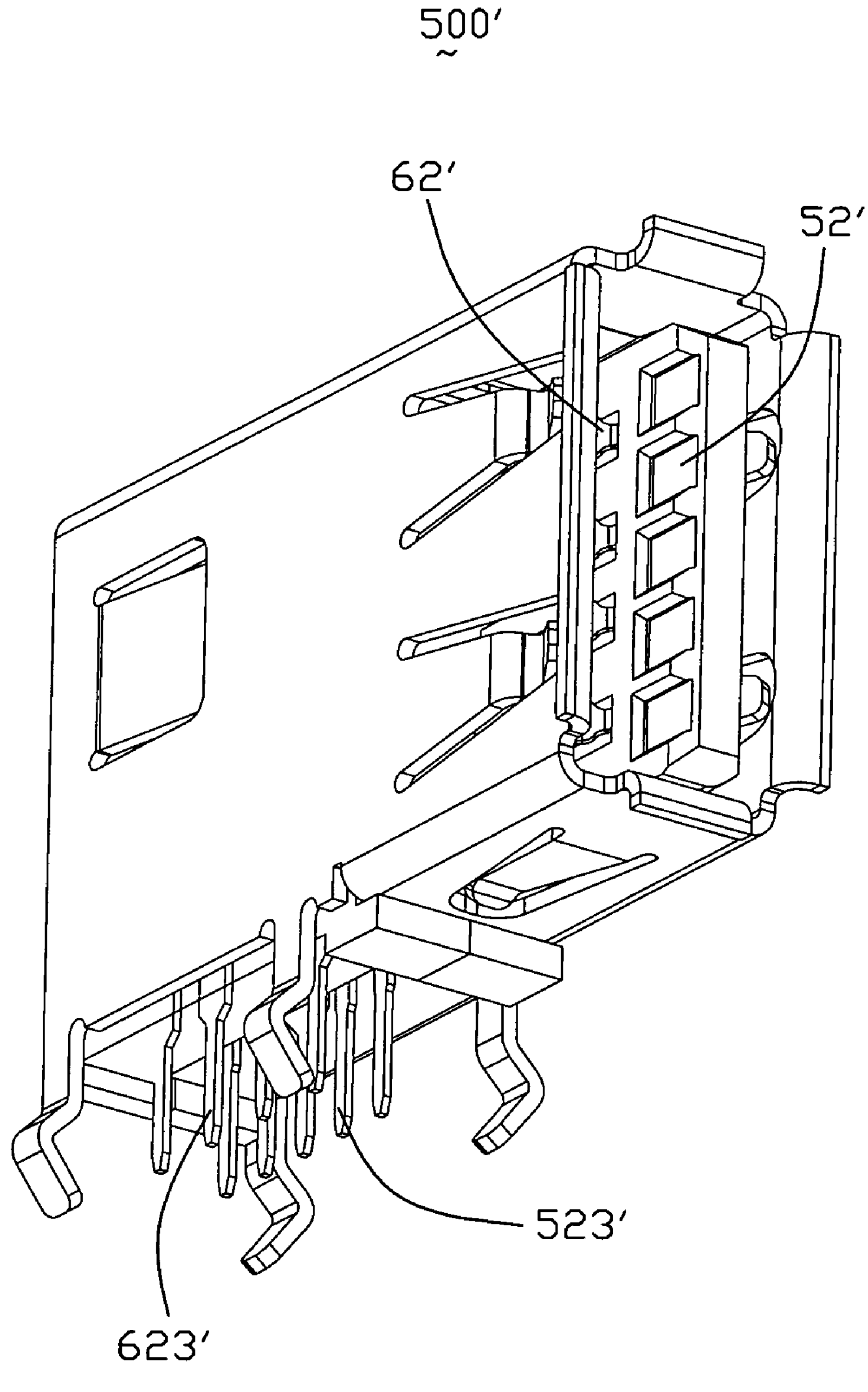
Figure 14:
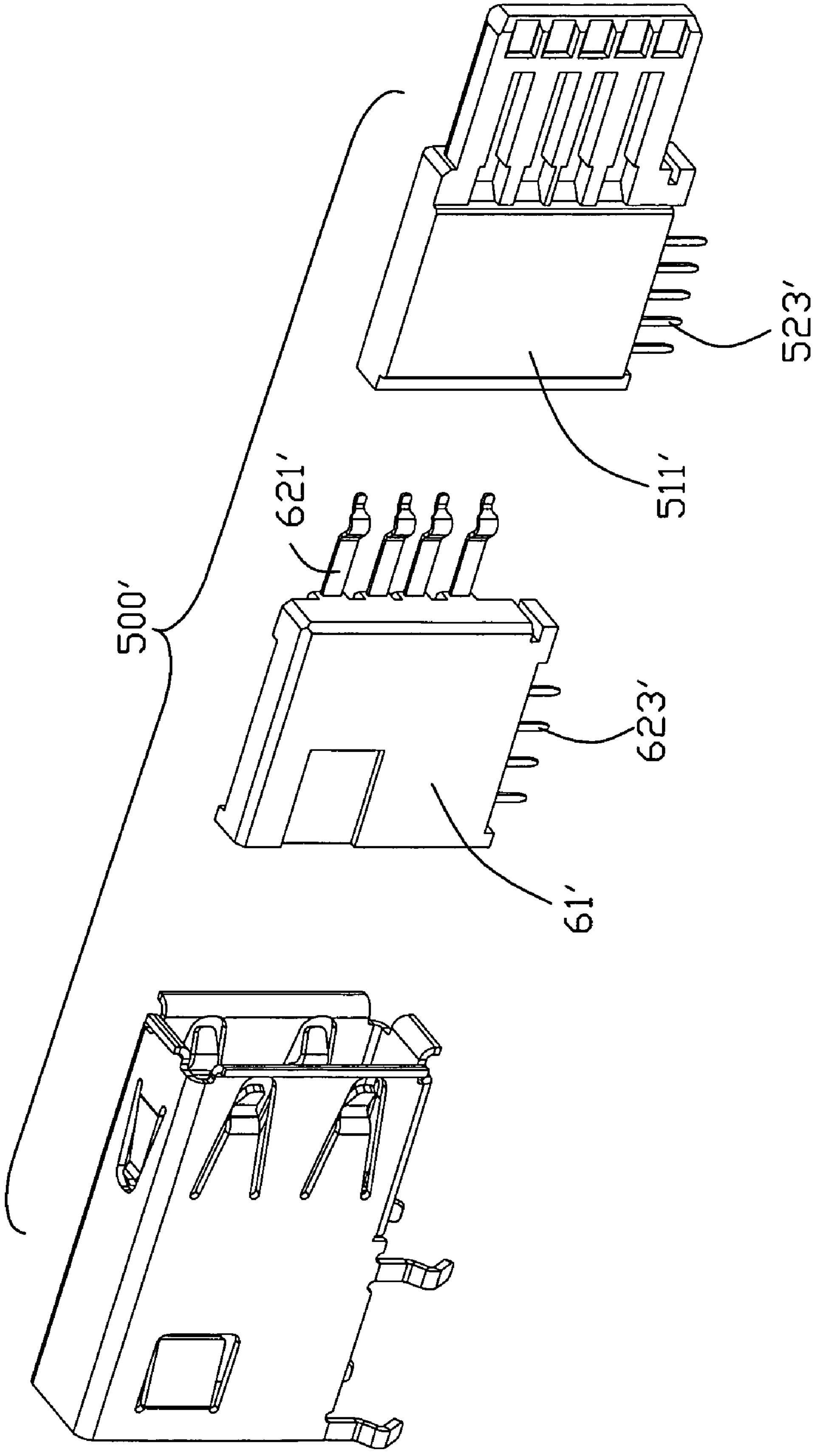

3 is a view similar to FIG. 2, while taken from another aspect;

FIG. 4 is an exploded view of the electrical connector shown in FIG. 1;

FIG. 5 is a view similar to FIG. 4, while taken from another aspect;

FIG. 6 is a partial exploded view of an electrical connector according to a second embodiment of the present invention;

FIG. 7 is an exploded view of the electrical connector shown in FIG. 6;

FIG. 8 is a perspective view of an electrical connector according to a third embodiment of the present invention;

FIG. 9 is a partial exploded view of the electrical connector shown in FIG. 8;

FIG. 10 is a view similar to FIG. 9, while taken from another aspect;

FIG. 11 is an exploded view of the electrical connector shown in FIG. 8;

FIG. 12 is a view similar to FIG. 11, while taken from another aspect;

FIG. 13 is a perspective view of an electrical connector according to a fourth embodiment of the present invention;

FIG. 14 is a partial exploded view of the electrical connector shown in FIG. 13.

Figure 15:
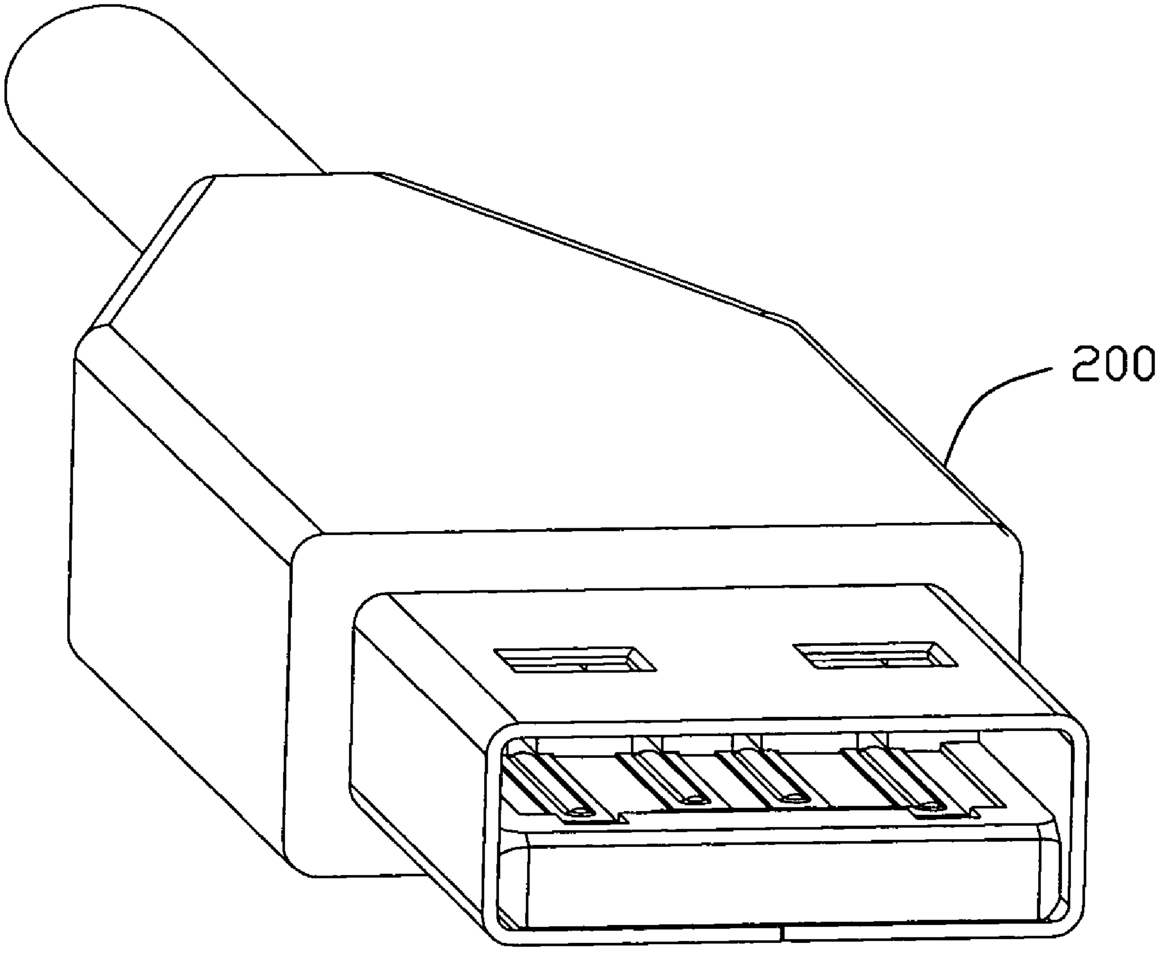
FIG. 15 (PRIOR ART)

FIG. 15 is a perspective view of a standard USB 2.0 A type plug.

DETAILED DESCRIPTION OF THE PREFERRED EMBODIMENT

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Figure 3:
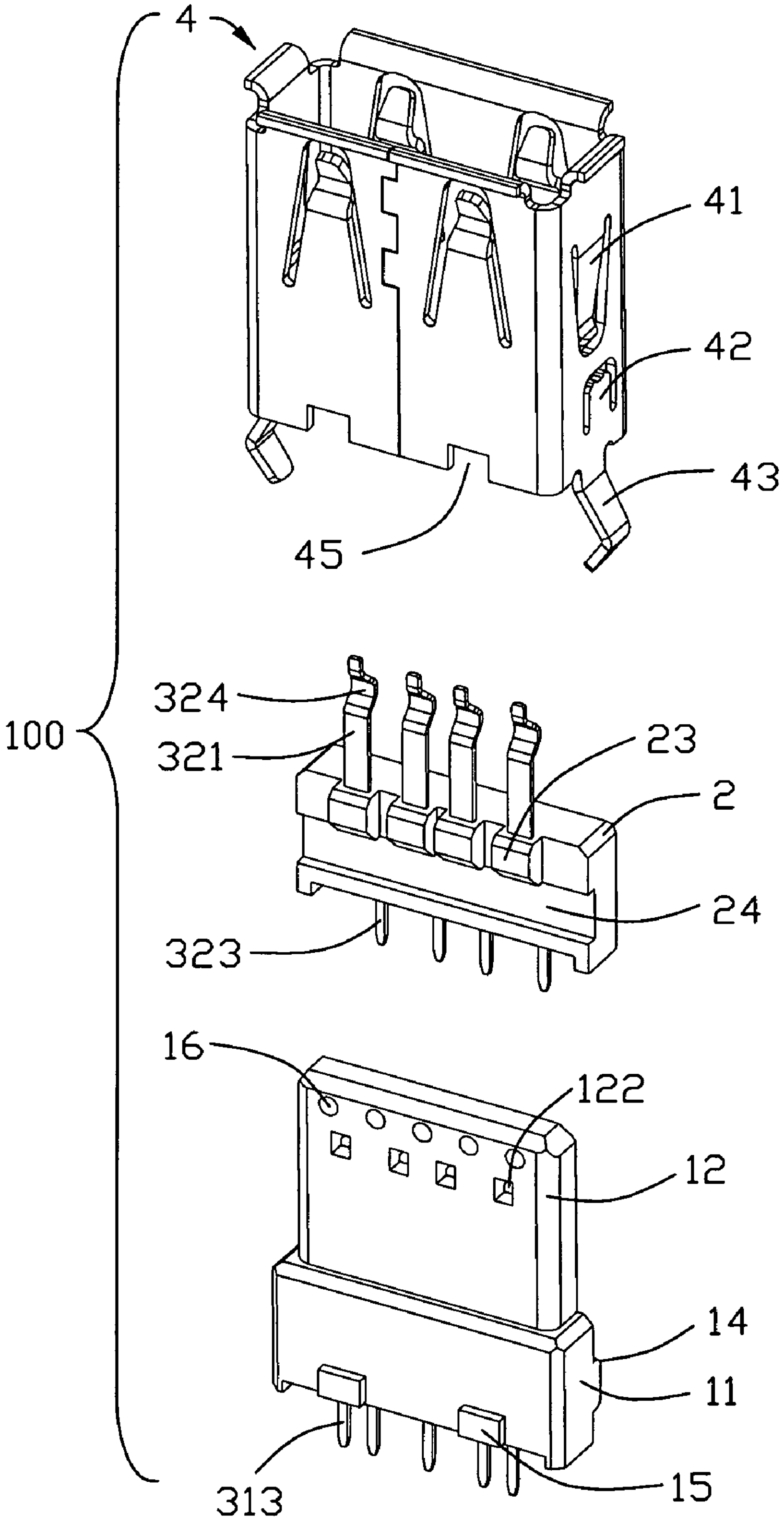

Referring to FIGS. 1-3, an electrical connector 100 according to a first embodiment of the present invention is disclosed. The electrical connector 100 extends along a vertical direction and defines an inserting port 10 for connecting a corresponding plug (not shown). The electrical connector 100 comprises a first contact module and a second contact module fixed with each other, and a metal shell 4 covering the first and second contact modules together. The first contact module comprises a first housing 1 and a plurality of first contacts 31 insert molded in the first housing 1. The second contact module comprises a second housing 2 and a number of second contacts 32 insert molded in the second housing 2.

Referring to FIG. 3 and FIG. 4, the first housing 1 comprises a main body 11 and a tongue 12 extending upwardly from a top end of the main body 11. A geometric profile of the tongue 12 is substantially same as that of a standard USB 2.0 A type receptacle. The main body 11 defines a plurality of installed grooves 17 at an inner side thereof, and a block 14 adjacent to the installed grooves 17 projecting inwardly and extending along a width direction thereof. The installed grooves 17 are located at an upper position of the block 14. The main body 11 has a pair of protrusions 15 extending outwardly from an outside surface thereof for engaging with the metal shell 4.

The tongue 12 defines a plurality of receiving slots 13 and a number of recesses 19 recessed from a side surface 121 thereof. The receiving slots 13 and recesses 19 are arranged in two rows along an inserting direction of the plug. The receiving slots 13 communicate with the installed grooves 17. The recesses 19 extend to a free end of the tongue 12. The recesses 19 are located at an upper portion of the receiving slots 13 and spaced apart from the receiving slots 13 along a length direction of the tongue 12. The tongue 12 has a plurality of ribs 18 between adjacent recesses 19 to separate the recesses 19 with each other. The tongue 12 is formed with a plurality of position holes 16 communicating with the recesses 19 and a number of depressions 122 located at a lower position of the position holes 16 and between adjacent first contacts 31. A mold (not shown) used for molding the first housing 1 has a plurality of small posts at the position of position holes 16 for positioning the first contacts 31, and a number of pins at the position of depressions 122 for preventing the adjacent first contacts 31 from contacting with each other.

The first contacts 31 are insert molded into the first housing 1 and each comprises a first contact portion 311 insert molded in the tongue 12, a first soldering portion 313 extending out of the first housing 1 for being soldered on a circuit board (not shown), and a first connecting portion 312 connecting the first contact portion 311 and the first soldering portion 313. The first contact portion 311 is flat and extends to the free end of the tongue 12. The first contact portions 311 are located at the recesses 19 and partly exposed to the inserting port 10, but not extend out of the side surface 121. The first connecting portion 312 bends backwardly from a lower end of the first contact portion 311 and extends downwardly, therefore the first contact portion 311 and the first connecting portion 312 are located at different plane along a thickness direction of the tongue 12. The first connecting portion 312 is insert molded in the first housing 1 for fixing the first contact 31 in the first housing 1, thereby the first contacts 31 need not be inserted into the first housing 1 for decreasing assembly cost of the electrical connector 100, and the first contacts 31 can not puncture the first housing 1. The first soldering portion 313 extends downwardly from a lower end of the connecting portion 312.

The first contacts 31 comprise two pairs of differential signal contacts and a grounding contact. The grounding contact is arranged between the two pairs of differential signal contacts for reducing disturb between two pairs of differential signal contacts. The first connecting portion 312 of the grounding contact is wider than that of the differential signal contacts for better reducing disturb between two pairs of differential signal contacts.

The second housing 2 has a plurality of projections 23 at an inner side thereof for engaging with the installed grooves 17 of the first housing 1, an installed slot 24 at a lower side of the projections 23 for engaging with the block 14, and a pair of protrusions 25 extending outwardly from an outside surface thereof for engaging with the metal shell 4. Therefore, the second housing 2 is arranged at a side portion of the tongue 12 along a width direction of the first housing 1 and located at a rear portion of the tongue 12 along a length direction of the first housing 1. The second housing 2 has an upper face 21 facing the inserting port 10 and a lower face 22 facing the circuit board.

Each second contact 32 has a second contact portion 321 extending upwardly, a second soldering portion 323 extending downwardly to connect the circuit board, and a second connecting portion 322 connecting the second contact portion 321 and the second soldering portion 323. The second contact portion 321 has an arc elastic portion 324. The second connecting portion 322 bends forwardly from a lower end of the second contact portion 321 and extends downwardly, therefore, the second contact portions 321 and the second connecting portions 322 are located at different plane along a thickness direction of the second housing 2. The second connecting portion 322 is insert molded in the second housing 2 for fixing the second contact 32 in the second housing 2, thereby the second contacts 32 need not be inserted into the second housing 2 for decreasing assembly cost of the electrical connector 100. The second contact portion 321 extends out of the upper face 21 along a length direction of the second housing 2.

When the second contact module is assembled to the first contact module, the second contact portion 321 is cantileveredly received in the receiving slots 13, and the second contact portion 321 is disposed above the side surface 121 and extends into the inserting port 10. Referring to FIG. 1, the first contact portion 311 and the second contact portion 321 are arranged at a same side of the tongue 12 along the thickness of the tongue 12, and the first contact portions 311 are located at an upper side of the second contact portions 321 and spaced apart from the second contact portions 321 along a length direction of the tongue 12. The flat first contact portion 311 and the elastic second contact portion 321 are located at different plane along the thickness direction of the tongue 12. The second contacts 32 are adapted for USB protocol and an arrangement of the second contacts is compatible to a standard USB 2.0 A type plug. The second contacts 32 comprise four contacts which are a power contact, a pair of differential signal contacts and a ground contact, and the differential signal contacts are located between the power contact and the ground contact.

The metal shell 4 is made of a piece of metal sheet, and covers the first housing 1 and the second housing 2. The metal shell 4 defines a plurality of openings 45 at a front side and rear side thereof for engaging with the protrusions 15, 25 respectively. The metal shell 4 comprises a plurality of spring arms 41 extending inwardly at each side thereof for engaging with the corresponding plug, and a pair of spring tabs 42 extending upwardly for engaging with the first housing 1 and the second housing 2. The metal shell 4 has a pair of mounting legs 43 extending downwardly from a lower end thereof for fastening on the circuit board.

As fully described above, the electrical connector 100 is based on the standard USB 2.0 A type receptacle and adds the first contacts 31 to the standard USB 2.0 A type receptacle, thereby the differential signal contacts in the first contacts 3 increase transmission speed of the electrical connector 100 of the present invention. In addition, the standard USB 2.0 A type plug (shown in FIG. 15) can be inserted into the electrical connector 100 of the present invention and electrically connect with the second contacts 32 for transmitting USB 2.0 signals. Because the first contacts 31 is flat and not extend out of the side surface, the standard USB 2.0 A type plug can not contact the first contact 31 when the standard USB 2.0 A type plug is withdrawn in the inserting port 10. Besides, the first contacts 31 and the second contacts 32 are insert molded in the first housing 1 and the second housing 2 respectively for decreasing assemble cost, and the contacts 31, 32 can not puncture the first housing 1 and the second housing 2.

Referring to FIG. 6 and FIG. 7, an electrical connector 100 according to a second embodiment of the present invention is disclosed. Structures of the electrical connectors 100, 100' in the first and second embodiments is similar, and a small difference is that: the first soldering portion 313' of the first contact 31' is bended outwardly and horizontally from a lower end of first connecting portion 312' and extends out of the main body 11' to be surface mounted on a print circuit board, and the second soldering portion 323' of the second contact 32' is bended outwardly and horizontally from a lower end of the second connecting portion 322' and extends out of the second housing 2' to be surface mounted on a print circuit board. The first soldering portion 313' extends opposite to the second soldering portion 323' and perpendicular to the first contact portion 311'. The electrical connector 100' of the second embodiment can achieve the purpose of the present invention also.

Referring to FIGS. 8-12, an electrical connector 500 according to a third embodiment of the present invention is disclosed. The electrical connector 500 also comprises a first contact module 5 and a second contact module 6 engaging with each other and a metal shell 7 covering the first and second contact modules 5, 6. The first contact module 5 comprises a first housing 51 and a plurality of first contacts 52 insert molded in the first housing 51. The second contact module 6 comprises a second housing 61 and a plurality of second contacts 62 insert molded in the second housing 61. The first contacts 52 transmit the same signals as the first contacts 31 transmit. The second contacts 62 transmit the same signals as the second contacts 32 transmit.

The first housing 51 comprises an upright main body 511 and a tongue 512 extending forwardly from a front end of the main body 511. A geometric profile of the tongue 512 is substantially same as that of a standard USB 2.0 A type receptacle also. The main body 511 defines a plurality of installed grooves 5111 at an inner side thereof, and a block 5112 adjacent to the installed grooves 5111 projecting inwardly, and a locking recess 513 recessed from an outside surface thereof. The tongue 512 has a structure similar to the tongue 12 except that the tongue 12 extends vertically, but the tongue 512 extends uprightly.

The first contacts 52 are insert molded into the first housing 51 and each comprises a first contact portion 521 insert molded in the tongue 512, a first soldering portion 523 extending out of the first housing 51 for being soldered on a circuit board (not shown), and a first connecting portion 522 connecting the first contact portion 521 and the first soldering portion 523. The arrangement of the first contact portion 521 on the first tongue 512 is same to the arrangement of the first contact portion 311 on the first tongue 12. Each first connecting portion 522 has a first level portion 5221 extending backwardly and outwardly from the first contact portion 521, a first inclined portion 5222 extending backwardly and downwardly from a rear end of the first level portion 5221, and a first vertical portion 5223 extending downwardly from a lower end of the first inclined portion 5222. The first soldering portion 523 bending outwardly from a lower end of the first vertical portion 5223 and perpendicular to the first vertical portion 5223. The first contact portions 521 and the first level portions 5221 are arranged in different plane along a thickness direction of the tongue.

The first contacts 52 comprise two pairs of differential signal contacts and a grounding contact. The grounding contact is arranged between the two pairs of differential signal contacts for reducing disturb between two pairs of differential signal contacts. The first connecting portion 522 of the grounding contact is wider than that of the differential signal contacts for better reducing disturb between two pairs of differential signal contacts.

The second housing 61 has a plurality of projections 611 at an inner side thereof for engaging with the installed grooves 5111 of the first housing 51, an installed slot 612 at a lower side of the projections 611 for engaging with the block 5112, and a locking recess 613 recessed from an outside surface thereof for engaging with the metal shell 7. Therefore, the second housing 61 is arranged at a side portion of the tongue 512 along a width direction of the first housing 51 and located at a rear portion of the tongue 512 along a length direction of the first housing 51.

Each second contact 62 has a second contact portion 621 extending forwardly, a second soldering portion 623 connecting the circuit board, and a second connecting portion 622 connecting the second contact portion 621 and the second soldering portion 623. The structure of the second contact portion 621 is same to that of the second contact portions 321. Each second connecting portion 622 has a second level portion 6221 extending backwardly and outwardly from the second contact portion 621, a second inclined portion 6222 extending backwardly and downwardly from a rear end of the second level portion 6221, and a second vertical portion 6223 extending downwardly from a lower end of the second inclined portion 6222. The second soldering portion 623 bending outwardly from a lower end of the second vertical portion 6223 and perpendicular to the second vertical portion 6223. The second contact portion 621 extends out of a front face of the second housing 61 along a front-to-back direction of the second housing 61. The second contact portions 621 and the second level portions 6221 are arranged in different plane along a thickness direction of the second housing 61.

When the second contact module 6 is assembled to the first contact module 5, the second contact portion 621 is cantileveredly received in the tongue 512. The arrangement of the second contact portion 621 on the tongue 512 is same to that of the second contact portion 321 on the tongue 12. The second contacts 621 are adapted for USB protocol and an arrangement of the second contacts 621 is compatible to a standard USB 2.0 A type plug. The second contacts 621 comprise four contacts which are a power contact, a pair of differential signal contacts and a ground contact, and the differential signal contacts are located between the power contact and the ground contact.

The metal shell 7 is made of a piece of metal sheet, and covers the first housing 51 and the second housing 61. The metal shell 7 has a pair of side walls 71, a top wall 72 and a lower wall 73. Each side wall 71 has a pair of spring arms 711 extending forwardly for engaging with a corresponding plug, and a spring tab 712 at a rear position thereof for locking with the locking recess 513, 613. The top wall 72 and lower wall 73 each has a spring arm 74 extending backwardly for fastening the plug. Each side wall 71 has a pair of mounting legs 713 extending downwardly for mounting to the circuit board.

Referring to FIGS. 8-12, the electrical connector 500 according to the third embodiment of the present invention is based on the standard USB 2.0 A type receptacle and adds the first contacts 52 to the standard USB 2.0 A type receptacle too, thereby the differential signal contacts in the first contacts 52 increase transmission speed of the electrical connector 500 in the present invention. In addition, the standard USB 2.0 A type plug (shown in FIG. 15) can be inserted into the electrical connector 500 of the present invention and electrically connect with the second contacts 62 for transmitting USB 2.0 signals. Besides, the first contacts 52 and the second contacts 62 are insert molded in the first housing 51 and the second housing 61 respectively for decreasing assemble cost, and the contacts 52, 62 can not puncture the first housing 51 and the second housing 61.

Referring to FIGS. 13 and 14, an electrical connector 500' according to a fourth embodiment of the present invention is disclosed. Structures of the electrical connectors 500, 500' in the third and fourth embodiments are similar, and a small difference is that: the first soldering portion 523' of the first contact 52' extends downwardly and perpendicularly from a lower end of first connecting portion and extends out of the main body 511', and the second soldering portion 623' of the second contact 62' extends downwardly and perpendicularly from a lower end of the second connecting portion and extends out of the second housing 61'. The electrical connector 500' of the fourth embodiment can achieve the purpose of the present invention also.

As fully described above, different embodiments of the present invention have been disclosed, and all electrical connectors 100, 100', 500 and 500' are based on the standard USB 2.0 A type receptacle, and each adds a plurality of first contacts with two pairs of differential signal contacts than the standard USB 2.0 proposal for increasing the transmission speed thereof. In addition, each electrical connector 100, 100', 500 or 500' has a pair of contact modules for being assembled conveniently and protecting the housing from puncturing.

It is to be understood, however, that even though numerous, characteristics and advantages of the present invention have been set fourth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. An electrical connector defining an inserting port for connecting a corresponding plug, comprising:

a first contact module comprising a first housing and a plurality of first contacts insert molded in the first housing, the first housing comprising a main body and a tongue extending to the inserting port from the main body, the main body defining a plurality of installed grooves at an inner side thereof, the tongue defining a plurality of receiving slots and a number of recesses recessed from a side surface thereof, the receiving slots and recesses being arranged in two rows along an inserting direction of the plug, each first contact has a flat contact portion retained in the recesses and a first soldering portion to be soldered on a circuit board;

a second contact module comprising a second housing and a plurality of second contacts insert molded in the second housing, the second housing having a plurality of projections at an inner side thereof to engage with the installed grooves, each second contact having an elastic contact portion extending out of the second housing along a length direction of the second housing and positioned in the receiving slot; and a metal shell covering the first contact module and the second contact module.

2. The electrical connector according to claim 1, wherein a geometric profile of the tongue is substantially same as that of a standard USB 2.0 A type receptacle, and the second contacts are adapted for USB protocol and an arrangement of the second contacts is compatible to a standard USB 2.0 A type plug.

3. The electrical connector according to claim 1, wherein the second housing is arranged at a side portion of the tongue along a width direction of the first housing and located at a rear portion of the tongue along a length direction of the first housing.

4. The electrical connector according to claim 1, wherein the receiving slots communicate with the installed grooves, and the recesses are spaced apart from the receiving slots along a length direction of the tongue.

5. The electrical connector according to claim 1, wherein the recesses extend to a free end of the tongue.

6. The electrical connector according to claim 1, wherein the tongue is formed with a plurality of ribs between adjacent recesses to separate the recesses with each other.

7. The electrical connector according to claim 1, wherein the elastic contact portion is disposed above the side surface, and the flat contact portion is partly exposed to the inserting port and not extend out of the side surface.

8. The electrical connector according to claim 1, wherein each first contact has a first connecting portion between the flat contact portion and the first soldering portion and insert molded in the first housing, and the flat contact portions and the first connecting portions are arranged in different plane along a thickness direction of the tongue.

9. The electrical connector according to claim 1, wherein each second contact has a second soldering portion to connect the circuit board and a second connecting portion between the elastic contact portion and the second soldering portion and insert molded in the second housing, and the elastic contact portions and the second connecting portions are arranged in different plane along a thickness direction of the second housing.

10. The electrical connector according to claim 1, wherein the first housing has a block adjacent to the installed grooves and projecting inwardly, and the second housing defines an installed slot to engage with the block.

11. The electrical connector according to claim 1, wherein the tongue is formed with a plurality of position holes communicating with the recesses for positioning the first contacts and a plurality of depressions between adjacent first contacts to prevent the adjacent first contacts from contacting with each other.

12. An electrical connector defining an inserting port for connecting a corresponding plug, comprising:

a first contact module comprising a first housing and a plurality of first contacts insert molded in the first housing, the first housing having a tongue extending into the inserting portion, each first contact having a first contact portion extending to a free end of the tongue;

a second contact module comprising a second housing and a plurality of second contacts insert molded in the second housing, each second contact having a second contact portion extending out of the second housing along a length direction of the second housing, the second contact portions extending to the tongue and offsetting with the first contact portion along a length direction of the tongue; and a metal shell fixing the first contact module and the second contact module together.

13. The electrical connector according to claim 12, wherein the first contact portions and the second contact portions are arranged at a same side of the tongue and located at different plane along a thickness direction of the tongue.

14. The electrical connector according to claim 13, wherein the tongue defines a plurality of receiving slots adjacent to the first contact portions in the length direction of the tongue and spaced apart from the first contact portions.

15. The electrical connector according to claim 14, wherein the second contact portions are cantileverdly received in the receiving slots and extend out of the tongue along a thickness direction of the tongue.

16. The electrical connector according to claim 13, wherein a geometric profile of the tongue is substantially same as what of a standard USB 2.0 A type receptacle, and the second contacts are adapted for USB protocol and an arrangement of the second contacts is compatible to a standard USB 2.0 A type plug.

17. An electrical connector comprising:

a first insulative unit defining a mating tongue with opposite first and second faces thereof, a plurality of passageways formed in the first face;

a plurality of first contacts disposed in the first unit, each of the first contacts defining a planar un-deflectable contacting section exposed upon a front portion of the first face;

a second insulative unit;

a plurality of second contacts disposed in the second unit with a curved deflectable contacting portion extending forward beyond the second unit and extending into the corresponding passageway with a contact point region exposed outside of the mating tongue away from the first face; wherein said first unit and said second unit are assembled with each other.

18. The electrical connector as claimed in claim 17, wherein said first contacts all have the same dimensioned contacting sections while a main body of a center one of said first contacts is wider than those of others.

* * * * *